(12) United States Patent
Salta, III

(10) Patent No.: US 7,148,087 B2
(45) Date of Patent: Dec. 12, 2006

(54) ELECTRONIC PACKAGE HAVING A FOLDED FLEXIBLE SUBSTRATE AND METHOD OF MANUFACTURING THE SAME

(75) Inventor: José R. Salta, III, Metro Manila (PH)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/220,949

(22) Filed: Sep. 6, 2005

(65) Prior Publication Data

US 2006/0008949 A1 Jan. 12, 2006

Related U.S. Application Data

(62) Division of application No. 10/668,508, filed on Sep. 22, 2003, now Pat. No. 6,972,482.

(51) Int. Cl.
*H01L 21/50* (2006.01)
*H01L 21/48* (2006.01)
*H01L 21/44* (2006.01)

(52) U.S. Cl. .............. 438/126; 438/106; 438/125; 438/127

(58) Field of Classification Search .......... 438/106, 438/125–127; 257/686, 723–725
See application file for complete search history.

(56) References Cited

U.S. PATENT DOCUMENTS

| 6,300,679 | B1 | 10/2001 | Mukerji et al. |
| 6,323,060 | B1 * | 11/2001 | Isaak ..................... 438/109 |
| 6,351,029 | B1 | 2/2002 | Isaak |
| 2001/0006252 | A1 | 7/2001 | Kim et al. |
| 2001/0040793 | A1 | 11/2001 | Inaba |
| 2003/0020153 | A1 | 1/2003 | Bruce et al. |
| 2004/0104470 | A1 | 6/2004 | Bang et al. |

FOREIGN PATENT DOCUMENTS

WO PCT/US2004/030993 9/2004

* cited by examiner

*Primary Examiner*—Luan Thai
(74) *Attorney, Agent, or Firm*—Blakely, Sokoloff, Taylor & Zafman LLP

(57) ABSTRACT

An electronic package is provided and its method of construction. A microelectronic die is mounted to a flexible substrate. A mold cap is injection-molded over the die. The mold cap has a curved convex edge surface around which the flexible substrate wraps. Folding of the flexible substrate is controlled by the edge surface to reduce defects, ensure consistent form factor from one package to the next, and allow for the inclusion of a relatively resilient ground plane.

6 Claims, 8 Drawing Sheets

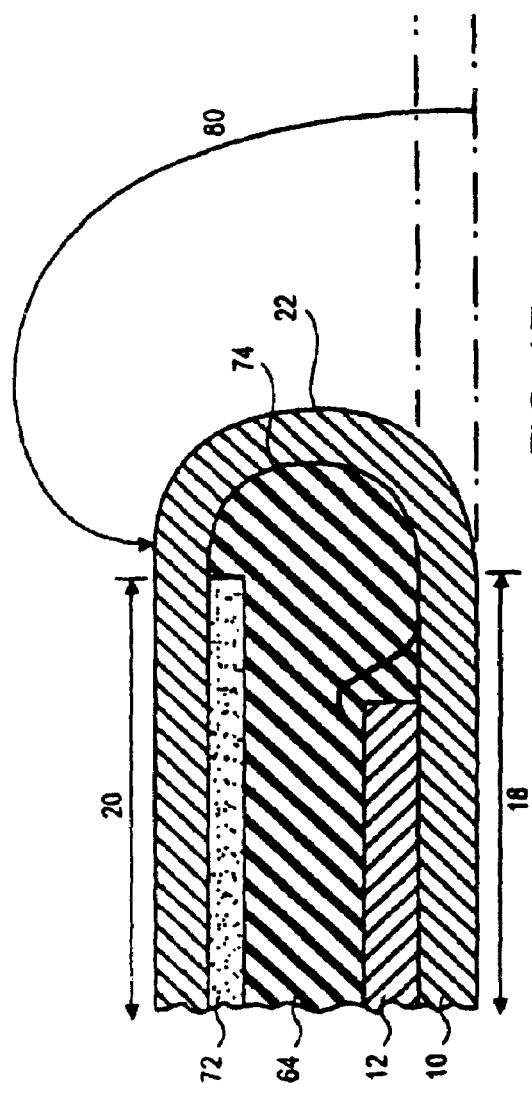
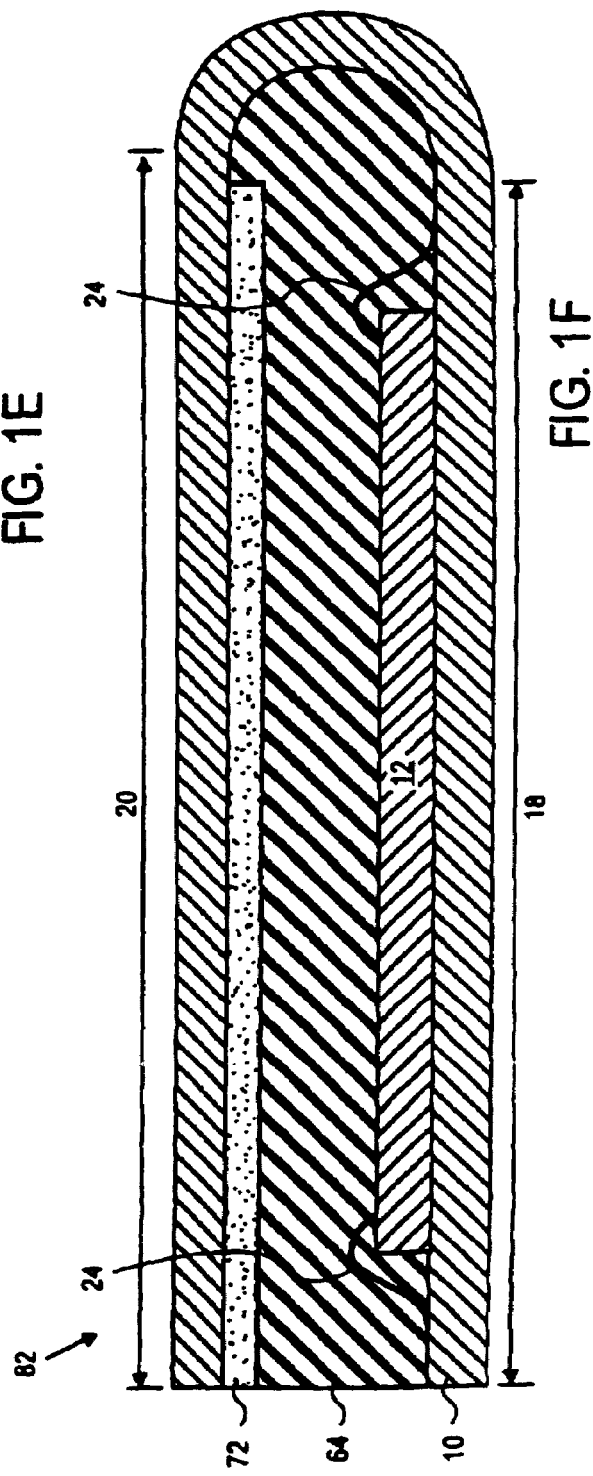

ELECTRONIC PACKAGE HAVING A FOLDED FLEXIBLE SUBSTRATE AND METHOD OF MANUFACTURING THE SAME

This application is a divisional application of U.S. patent application Ser. No. 10/668,508, filed on Sep. 22, 2003 now U.S. Pat. No. 6,972,482.

BACKGROUND OF THE INVENTION

1). Field of the Invention

This invention relates to an electronic package of the type having a microelectronic die and to a method of constructing an electronic package.

2). Discussion of Related Art

Integrated circuits are usually manufactured in and on semiconductor wafer substrates that are subsequently "singulated" or "diced" into individual microelectronic dies, each die carrying a respective integrated circuit. Such a die may be extremely thin, often less than 100 microns, and is subsequently mounted to a package substrate for purposes of structural integrity. The package substrate also has conductors in the form of traces thereon, metal lines therein, and/or vias therein to provide electric interconnection to other devices, often other integrated circuits or other dies mounted to the same package substrate.

In order to save space in x and y, it is often required to stack more than one die on top of one another in a z-direction, with integrated circuits of the dies interconnected with one another. Two dies can, for example, be mounted to a flexible substrate, and the flexible substrate be folded into positions such that the dies are above one another.

A package substrate of the aforementioned kind is usually uniformly flexible across its width. When one portion of the package substrate is folded over another portion of the package substrate, a fold region may be created at an undesired, even arbitrary area of the package substrate. Folding of the substrate at undesired areas may cause damage to certain components of the substrate. Bending at arbitrary locations may cause inconsistencies in bending from one assembly to the next, which may result in incorrect downstream packaging. Uncontrolled folding may also result in an undesired formfactor of the final electronic package.

FIGS. 4A–D illustrate one manner of forming an existing electronic package. In FIG. 4A, two microelectronic dies 310 are mounted via two other microelectronic dies 312 to a flexible package substrate 314. A cover piece 316 is located over the microelectronic dies 310, the microelectronic dies 312, and the flexible substrate 314. The cover piece 316 has a protrusion 318 contacting a fold portion 320 of the flexible substrate 314.

As illustrated in FIG. 4B, mold caps 324 are subsequently injection-molded within remaining spaces defined within the confines of the cover piece 316, microelectronic dies 310, microelectronic dies 312, and flexible substrate 314. When the cover piece 316 is removed, as illustrated in FIG. 4C, it can be seen that the mold caps 324 form square edges 326 facing one another, with the fold portion 320 between the edges 326.

As illustrated in FIG. 4D, the fold portion 320 is subsequently folded to place a portion of the flexible substrate 314 carrying one of the microelectronic dies 310 over a portion of the flexible substrate carrying the other microelectronic die 310. Folding of the fold portion 320 is not controlled, and is not consistent from one package to the next.

BRIEF DESCRIPTION OF THE DRAWINGS

The invention is described by way of examples with reference to the accompanying drawings, wherein:

FIG. 1E is a view similar to FIG. 1D, after the flexible substrate is folded around the mold cap, with a fold portion of the flexible substrate wrapping around a curved convex surface of the mold cap;

FIG. 1F is a view similar to FIG. 1E, showing the entire electronic assembly;

DETAILED DESCRIPTION OF THE INVENTION

An electronic package is provided and its method of construction. A microelectronic die is mounted to a flexible substrate. A mold cap is injection-molded over the die. The mold cap has a curved convex edge surface around which the flexible substrate wraps. Folding of the flexible substrate is controlled by the edge surface to reduce defects, ensure consistent formfactor from one package to the next, and allow for the inclusion of a relatively resilient ground plane.

Figure 1A:
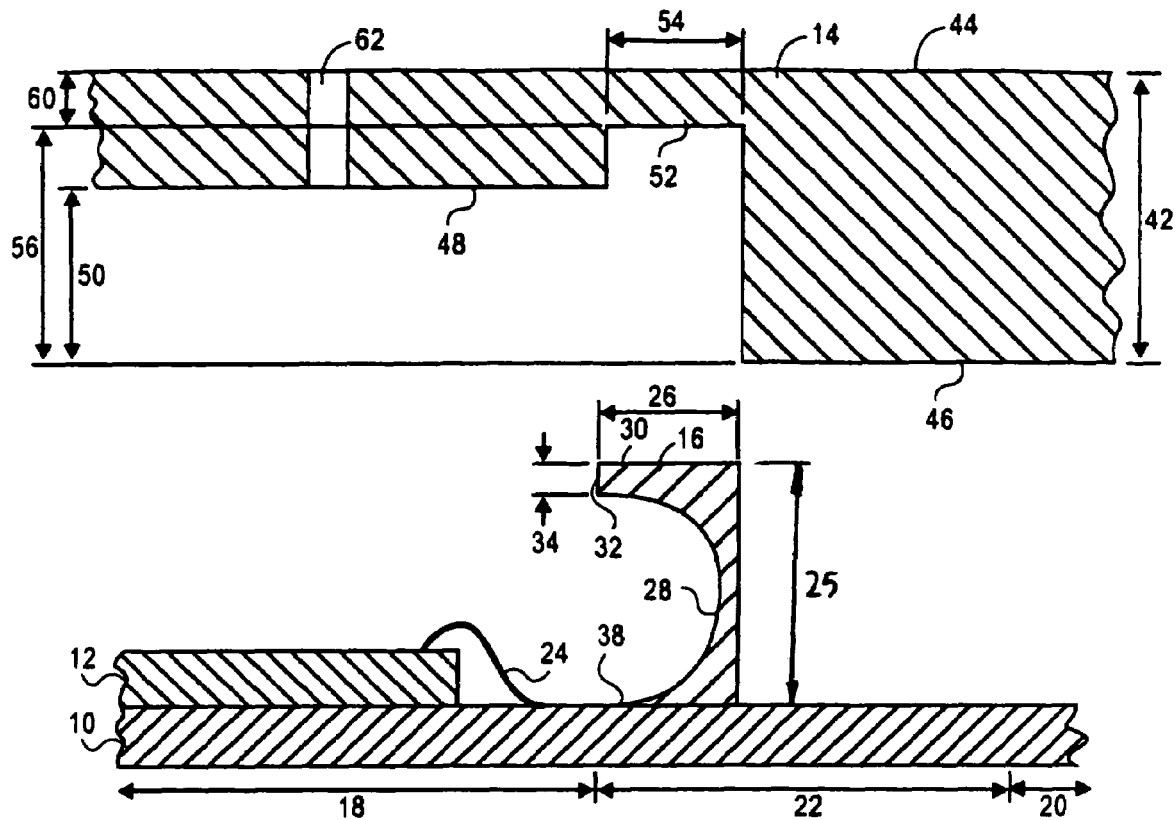
FIG. 1A is a cross-sectional side view a portion of a flexible substrate and a microelectronic die of an electronic package, together with a shape-defining piece and a cover piece used to construct the electronic package.

FIG. 1A of the accompanying drawings illustrates components of a partially fabricated electronic package, including a flexible substrate 10 and a microelectronic die 12, together with molding components including a cover piece 14 and a shape-defining piece 16.

The flexible substrate 10 has first and second portions 18 and 20 and a fold portion 22 between the first and second portions 18 and 20. The flexible substrate 10 includes a core of flexible dielectric material and conductors in the form of metal planes, metal lines, and vias formed in and on the flexible core.

The microelectronic die 12 is mounted to the first portion 18 of the flexible substrate 10. The microelectronic die 12 has an integrated circuit formed therein, and is electrically connected to terminals on the flexible substrate 10. In the present embodiment, the microelectronic die 12 is connected to the terminals of the flexible substrate 10 by way of wire bonding wires 24, each wire bonding wire 24 having one end connected to a contact on an upper surface of the microelectronic die 12 and an opposing end connected to a terminal on the flexible substrate 10.

The shape-defining piece 16 is placed on the fold portion 22, toward the left of the fold portion 22. The shape-defining piece 16 has a height 25 and a width 26. The shape-defining piece 16 further has a curved concave surface 28 facing left toward the microelectronic die 12. The curved concave surface 28 ends slightly below an upper surface 30 of the shape-defining piece 16, so that the shape-defining piece 16 has an upper left edge 32 with a height 34. The curved concave surface 28 extends all the way to a lower surface 36 of the shape-defining piece 16, so that the curved concave surface 28 and the lower surface 36 meet at a relatively sharp edge 38 on the flexible substrate 10.

The cover piece 14 has an overall height 42 as measured from an upper surface 44 to a lower surface 46 thereof. A first surface 48 is machined in the cover piece 14. The cover piece 14 is illustrated with the first surface 48 above the first portion 18 of the flexible substrate 10. The first surface 48 is above the lower surface 46 by a height 50.

A second surface 52 is machined into the cover piece 14 and is illustrated directly above the shape-defining piece 16. The second surface 52 has a width 54 which is approximately the same as the width 26 of the shape-defining piece 16. The second surface 52 is machined to a height 56 which is approximately the same as the height 25 of the shape-defining piece 16.

Because the second surface 52 is machined more deeply than the first surface 48, there is a differential height 60 between the height 56 and the height 50. The differential height 60 is more than the height 34 of the upper left edge 32 of the shape-defining piece 16.

An injection port 62 is formed into the cover piece 14. In the present example, the injection port 62 is formed from the upper surface 44 to the first surface 48 of the cover piece 14.

Figure 1B:
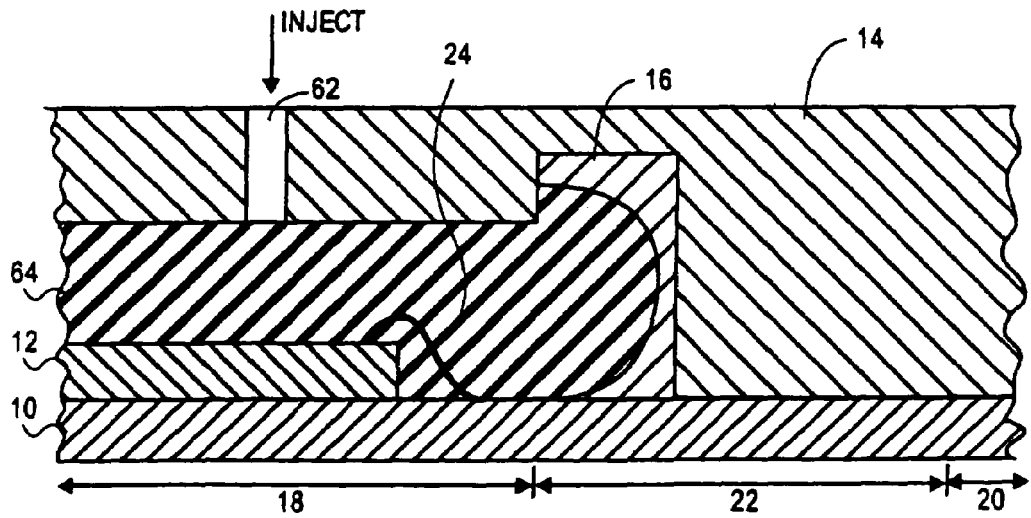
FIG. 1B is a view similar to FIG. 1, after the cover pieces are placed on the flexible substrate, and a mold cap of the electronic package is injection-molded within remaining spaces defined by other components of the electronic package, the shape-defining piece, and the cover piece.

FIG. 1B illustrates the components of FIG. 1A after the cover piece 14 is placed on the flexible substrate 10 and the shape-defining piece 16, and a mold cap 64 is injected and formed in the remaining space between the flexible substrate 10, microelectronic die 12, cover piece 14, and shape-defining piece 16. When comparing FIGS. 1A and 1B, it can be seen that the portion of the cover piece 14 having the second surface 52 fits over the shape-defining piece 16 because the width 54 of the second surface 52 is approximately the same as the width 26 of the shape-defining piece 16. The first surface 48 of the cover piece 14 is slightly below the upper left edge 32 of the shape-defining piece 16 because the differential height 60 is more than the height 34. The first surface 48 is spaced from an upper surface of the microelectronic die 12.

A liquid resin is injected through the injection port 62. The resin comes into contact and fills a space defined by the microelectronic die 12, areas of the first portion 18 not covered by the microelectronic die 12, the curved concave surface 28 of the shape-defining piece 16, and the first surface 48. The resin is then cured so that it solidifies.

Figure 1C:
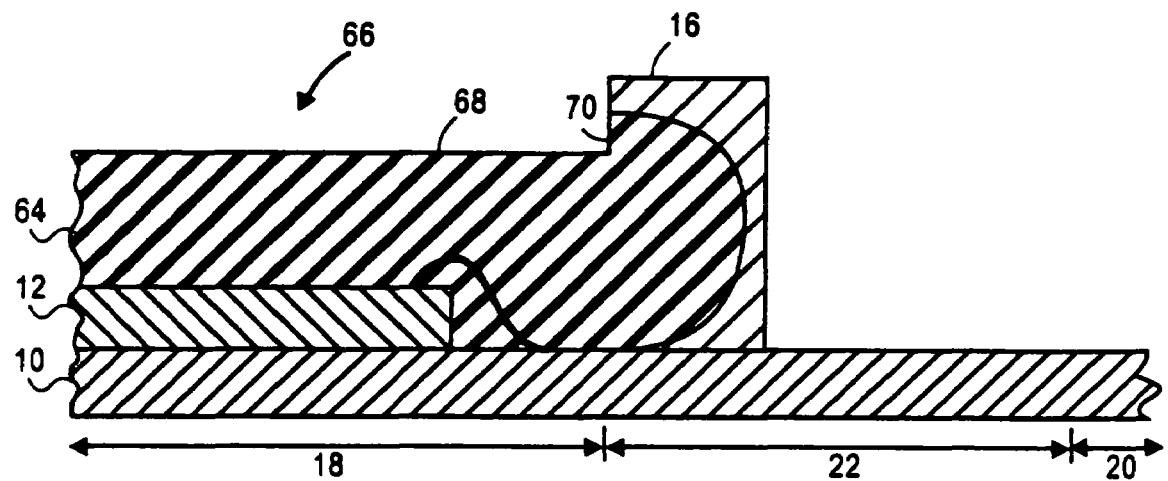
FIG. 1C is a view similar to FIG. 1B, after the cover piece is removed.

As illustrated in FIG. 1C, the cover piece 14 is subsequently removed. A recess 66 having an upper surface 68 and side surfaces 70 is formed in the mold cap 64 because the first surface (48 in FIG. 1A) is lower than the upper left edge (32 in FIG. 1A).

Figure 1D:
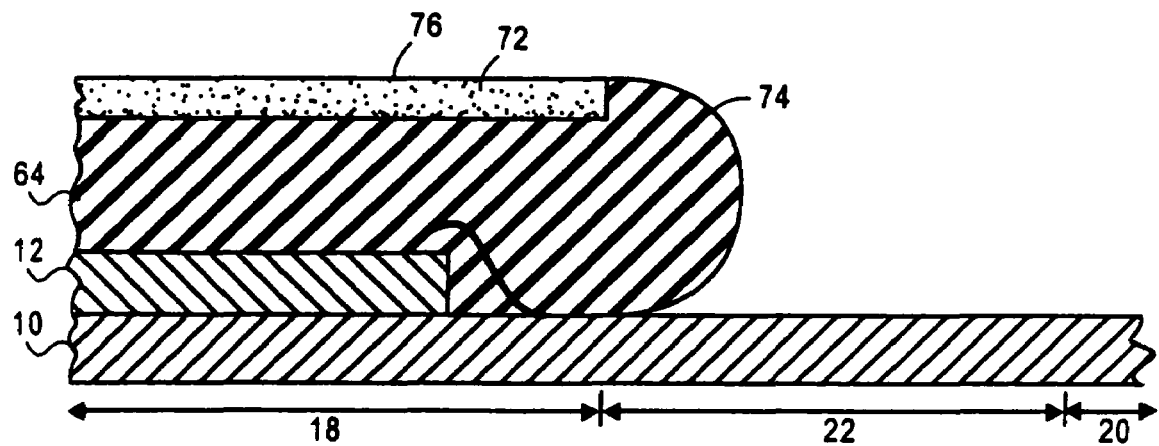
FIG. 1D is a view similar to FIG. 1C, after the shape-defining piece is removed and an adhesive is applied within a recess of the mold cap.

As illustrated in FIG. 1D, the shape-defining piece (16 of FIG. 1C) is subsequently removed, and an adhesive layer 72 is attached to the mold cap 64. The mold cap 64 has a curved convex surface 74 at an edge thereof. The curved convex surface 74 has the same shape as the curved concave surface of the shape-defining piece (28 and 16 in FIG. 1A). The adhesive layer 72 is formed within the recess (66 in FIG. 1C), so that an upper surface 76 thereof is substantially at the same height as a terminating edge of the curved convex surface 74.

Referring to FIG. 1E, the flexible substrate 10 is subsequently folded in a direction 80 around the mold cap 64. An inner surface of the fold portion 22 wraps around the curved convex surface 74 of the mold cap 64. The second portion 20 is positioned over and attached to the adhesive layer 72. A desired portion of the flexible substrate 10 is thus bent, whereas other portions remain substantially flat. By preventing folding in undesired areas, damage to certain components of the flexible substrate 10 can be prevented. Furthermore, bending at predefined locations results in consistencies in bending from one electronic package to the next, which leads to desired and corrected downstream packaging. Controlled folding also results in a consistent formfactor from one electronic package to the next.

FIG. 1F illustrates the entire electronic package 82. Wire bonding wires 24 are located on different sides of the microelectronic die 12. Edges of the flexible substrate 10 that originally opposed one another are now located in line above one another and in line with an edge of the mold cap 64.

Figure 2:
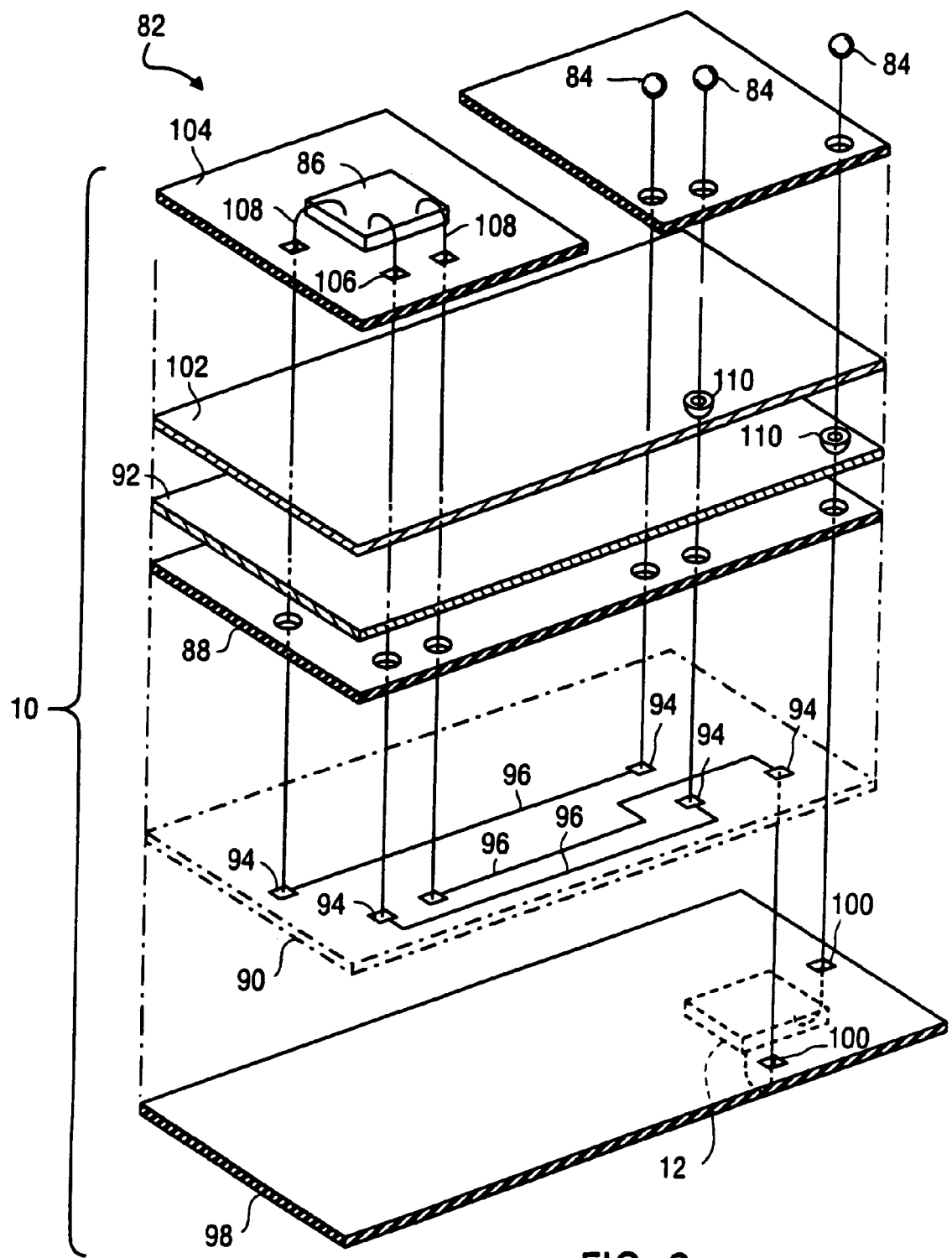
FIG. 2 is a perspective view of the electronic assembly with the flexible substrate shown in exploded form and before being folded.

FIG. 2 illustrates further components of the electronic package 82 before being folded. The electronic package 82, in addition to the flexible substrate 10 and the microelectronic die 12, further includes a plurality of conductive interconnection members 84, and may further include a second microelectronic die 86. A core of the flexible substrate 10 is a flexible layer 88 made of polyimide, an insulator. First and second thin metal layers 90 and 92 are formed on upper and lower surfaces of the flexible layer 88, respectively. The thin metal layers 90 and 92 are initially formed over the length and width of the flexible layer 88. The thin metal layer 90 is then patterned so that areas are removed and other areas, including contacts 94 and traces 96, remain behind.

A first solder mask 98 is formed over the remaining portions of the first thin metal layer 90. Areas 100 of the first solder mask 98 are selectively removed in an etching process, to expose the contacts 94 of the first thin metal layer 90.

A relatively resilient ground metal layer 102 is then plated on a surface of the second thin metal layer 92. A second solder mask 104 is subsequently formed on exposed surfaces of the ground metal layer 102, and patterned to form openings 106. The second microelectronic die 86 can be connected by way of wire bonding wires 108 through the openings 106 in the second solder mask 104 and openings in the ground metal layer 102, the second metal layer 92, and the flexible layer 88 to some of the contacts 94. The conductive interconnection members 84 are connected in a similar manner through vias 110 to some of the contacts 94. In such a manner, the microelectronic dies 12 and 86 can be interconnected to one another and to the conductive interconnection members 84. Signals can thus be provided through the conductive interconnection members 84 to either or both of the microelectronic dies 12 and 86, and the microelectronic dies 12 and 86 are in communication with one another.

The inclusion of the ground metal layer 102 provides the otherwise flexible substrate 10 with a certain amount of resiliency that tends to resist bending of the flexible substrate 10. Such a resistance in bending tends to create a large curvature when an attempt is made to bend the flexible substrate 10, instead of creating a small fold region. The shaped curved convex surface of the mold cap (74 and 64 in FIG. 1E) controls folding of the flexible substrate 10, even if the ground metal layer 102 is included.

FIGS. 3A–D illustrate the manufacture of an electronic package having first and second microelectronic dies 212 and 286 respectively mounted on the same side of an unfolded flexible substrate 210. In the present example, the electronic package includes microelectronic dies 220 and 222, to which the microelectronic dies 212 and 286 are respectively mounted. Wire bonding wires 224 connect the microelectronic dies 212 and 286 and the microelectronic dies 220 and 222 to the flexible substrate 210.

Figure 3A:
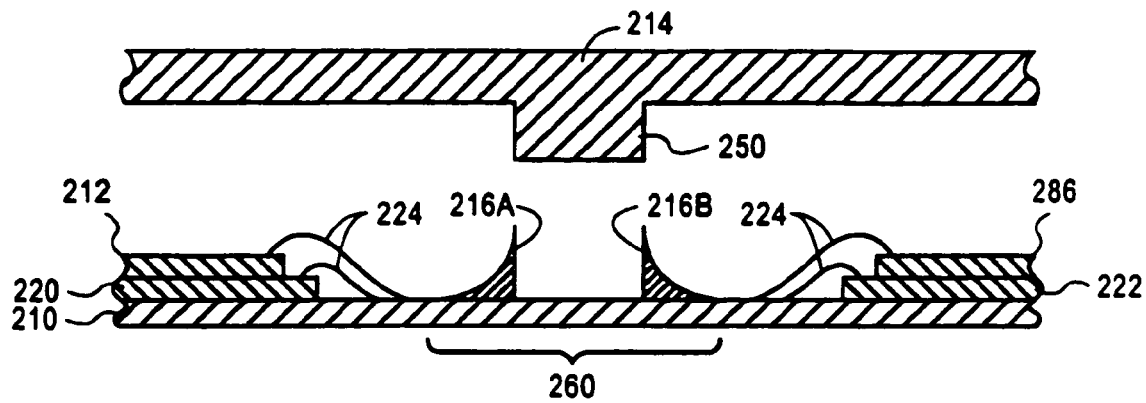
FIG. 3A is a cross-sectional side view of components of an electronic package, together with two shape-defining pieces and a cover piece used to construct the electronic package, according to another embodiment of the invention.

With specific reference to FIG. 3A, two shape-defining pieces 216A and 216B are located on a fold portion 260 of the flexible substrate 210. The first and second microelectronic dies 212 and 286 are located on first and second portions, respectively, on opposing sides of the fold portion 260. A cover piece 214 has a protrusion 250 which is approximately as high as the shape-defining pieces 216A and 216B, and has a width that is approximately equal to the space in between the shape-defining pieces 216A and 216B.

Figure 3B:
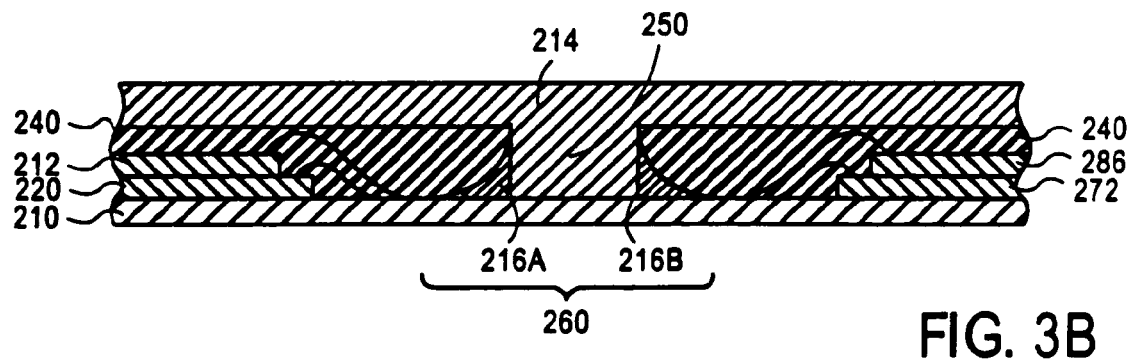
FIG. 3B is a view similar to FIG. 3A, after the cover piece is placed on a flexible substrate of the electronic package, and two mold caps are injection-molded, each over a respective microelectronic die of the electronic package.
Figure 3C:
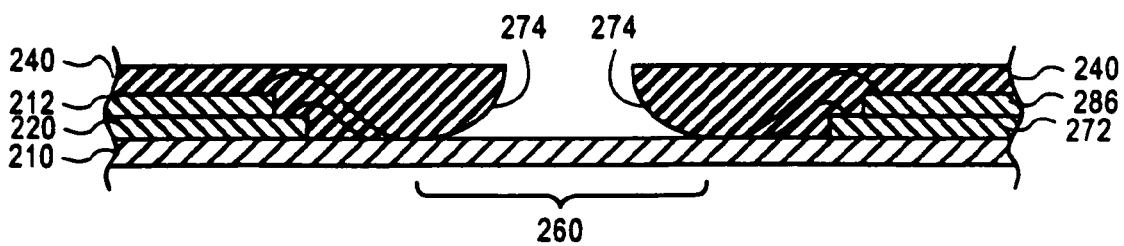
FIG. 3C is a view similar to FIG. 3B, after the cover and shape-defining pieces are removed.

With specific reference to FIG. 3B, the cover piece 214 is moved so that the protrusion 250 is inserted between the shape-defining pieces 216A and 216B, and remaining areas over the microelectronic dies 212 and 286 are injection-molded with mold caps 240. As illustrated in FIG. 3C, the cover piece 214 and shape-defining pieces 216A and 216B are subsequently removed. The mold caps 240 have curved convex surfaces 274. The curved convex surfaces 274 each form approximately a quarter of a circle, in cross-section, whereas the curved convex surface 74 illustrated in FIG. 1D forms approximately a semi-circle in cross-section.

Figure 3D:
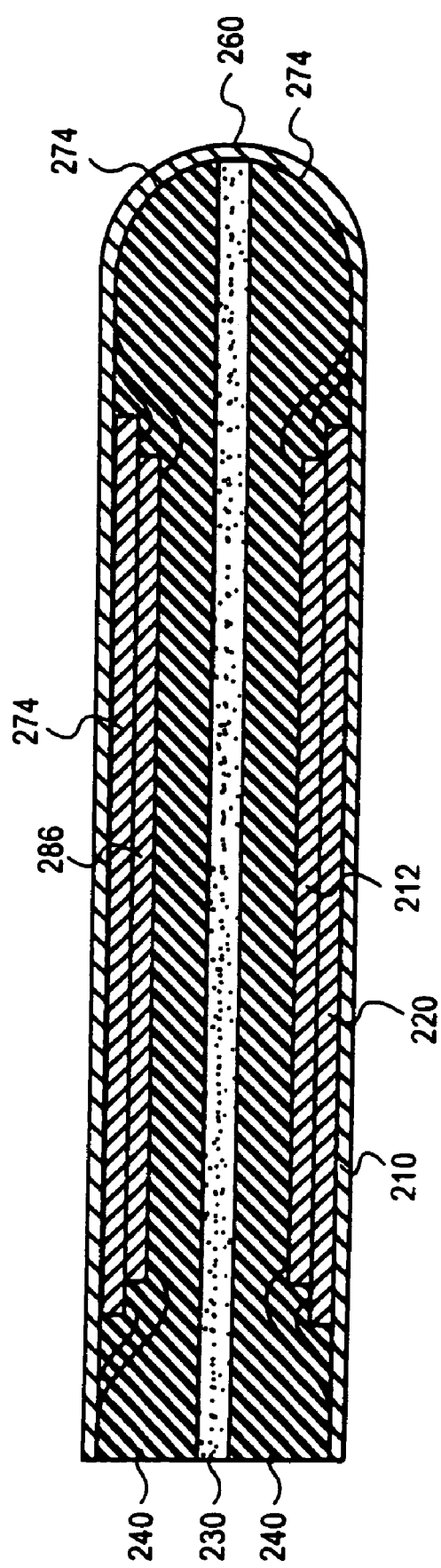
FIG. 3D is a view similar to FIG. 3C, illustrating the entire electronic package after the flexible substrate is folded and a fold portion thereof wraps around curved convex surfaces of both mold caps.
Figure 4A:
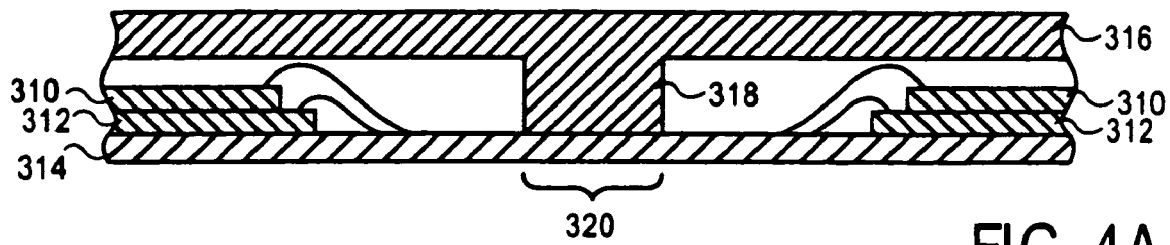
FIG. 4A is a cross-sectional side view of components of an electronic package with a mold cap thereon, according to the prior art.
Figure 4B:
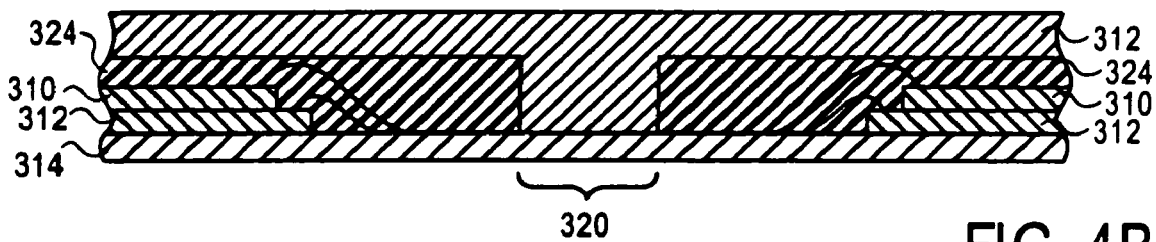
FIG. 4B is a view similar to FIG. 4A, after two mold caps are injection-molded over microelectronic dies of the electronic package.
Figure 4C:
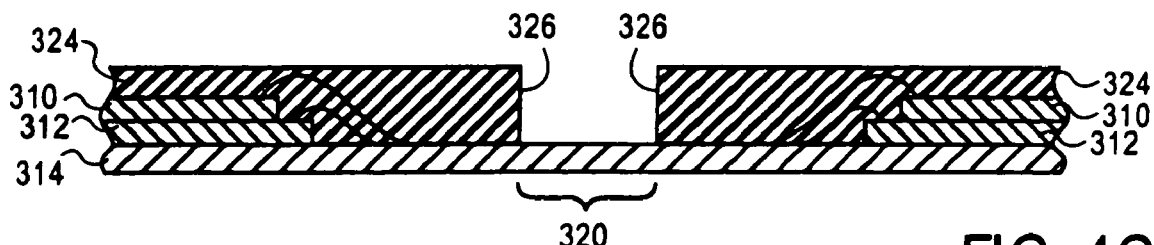
FIG. 4C is a view similar to FIG. 4B, after the cover piece is removed.
Figure 4D:
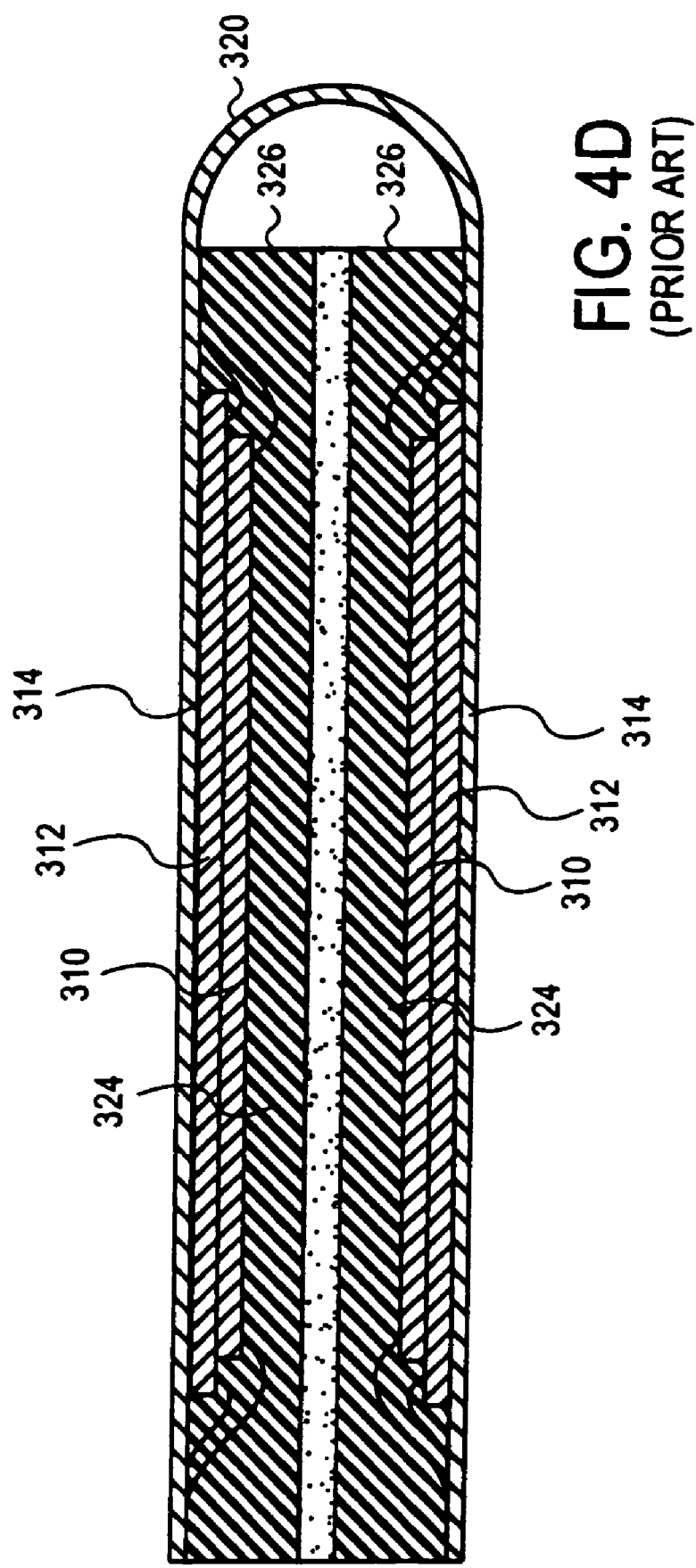
FIG. 4D is a view similar to FIG. 4C, after a flexible substrate of the electronic package is folded.

Referring to FIG. 3D, an adhesive layer 230 is applied to one of the mold caps 240, and the fold portion 260 of the flexible substrate 210 is folded to place the second microelectronic die 286 over the first microelectronic die 212. Folding of the flexible substrate 210 is controlled because the fold portion 260 wraps around the curved convex surfaces 274 of both mold caps 240.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of constructing an electronic package, comprising:
    mounting a first microelectronic die to a first portion of a substrate having a fold portion next to the first portion and a second portion next to the fold portion;
    locating a shape-defining piece on the substrate;
    positioning a fold-controlling member over the substrate by molding the fold-controlling member against a surface of the shape-defining piece;
    removing the shape-defining piece; and
    wrapping the fold portion of the substrate partially around a surface of the fold-controlling portion to place the second portion over the first portion.

2. The method of claim 1, wherein the fold-controlling member is a portion on a first mold cap over the first microelectronic die.

3. The method of claim 2, further comprising adhering the second portion to the first mold cap.

4. The method of claim 1, wherein the surface of the fold-controlling member around which the fold portion is wrapped is curved.

5. The method of claim 1, wherein the fold-controlling member is injection-molded.

6. The method of claim 1, wherein contacting surfaces of the shape-defining piece and fold-controlling member are concave and convex, respectively.

* * * * *